United States Patent
Ma et al.

(10) Patent No.: US 10,281,529 B2
(45) Date of Patent: May 7, 2019

(54) APPARATUS FOR MEASURING CELL INTERNAL RESISTANCE ONLINE AND MEASUREMENT METHOD THEREFOR

(71) Applicant: ITECH ELECTRONIC CO., LTD, Nanjing, Jiangsu Province (CN)

(72) Inventors: Haibo Ma, Nanjing (CN); Hui Xu, Nanjing (CN)

(73) Assignee: ITECH ELECTRONIC CO., LTD, Nanjing, Jiangsu (CN)

( * ) Notice: Subject to any disclaimer, the term of this patent is extended or adjusted under 35 U.S.C. 154(b) by 214 days.

(21) Appl. No.: 14/770,874

(22) PCT Filed: Sep. 26, 2014

(86) PCT No.: PCT/CN2014/087533
§ 371 (c)(1),
(2) Date: Aug. 27, 2015

(87) PCT Pub. No.: WO2015/085812
PCT Pub. Date: Jun. 18, 2015

(65) Prior Publication Data
US 2016/0187430 A1    Jun. 30, 2016

(30) Foreign Application Priority Data
Dec. 13, 2013 (CN) .......................... 2013 1 0676076

(51) Int. Cl.
*G01R 31/389* (2019.01)
*G01R 31/367* (2019.01)
(Continued)

(52) U.S. Cl.
CPC ......... *G01R 31/389* (2019.01); *G01R 31/367* (2019.01); *G01R 31/396* (2019.01); *G01R 27/14* (2013.01)

(58) Field of Classification Search
CPC .................................................. G01R 31/3662
(Continued)

(56) References Cited

U.S. PATENT DOCUMENTS

| 2003/0115001 | A1* | 6/2003 | Odaohhara | G06F 11/0721 |
| | | | | 702/63 |
| 2006/0113959 | A1* | 6/2006 | Honma | G01R 31/3662 |
| | | | | 320/128 |

(Continued)

FOREIGN PATENT DOCUMENTS

| CN | 1727909 | 2/2006 |
| CN | 101071161 | 11/2007 |

(Continued)

OTHER PUBLICATIONS

International Search Report and Written Opinion corresponding to International Patent Application No. PCT/CN2014/087533; 11 pages.

*Primary Examiner* — Min Huang
(74) *Attorney, Agent, or Firm* — Leason Ellis LLP

(57) ABSTRACT

An apparatus for online measurement of a battery internal resistance and a measurement method thereof are disclosed and applicable to online measure the internal resistance of a monomer cell in the battery, which include an excitation source circuit, electrically connected between any two monomer cells to be detected and a battery end and forming a loop respectively or simultaneously with the two monomer cells; an analog-to-digital conversion unit, for detecting and converting a response voltage of the monomer cell ends, and simultaneously electrically connected to the loop formed with the two monomer cells, for detecting and converting a current in the loop as well as detecting and converting a phase value between the current and the response voltage; a digital signal processing unit, electrically connected to the analog-to-digital conversion unit, for calculating the internal resistance value of the monomer cell to be detected after receiving a conversion signal from the analog-to-digital (Continued)

conversion unit; and realize precise, efficient and convenient internal resistance measurement of the monomer cell without damaging the monomer cell and sacrificing the online load of the battery.

16 Claims, 3 Drawing Sheets

(51) Int. Cl.
*G01R 31/396* (2019.01)
*G01R 27/14* (2006.01)

(58) Field of Classification Search
USPC .......................................................... 320/162
See application file for complete search history.

(56) References Cited

U.S. PATENT DOCUMENTS

| | | | | |
|---|---|---|---|---|
| 2006/0170397 | A1* | 8/2006 | Srinivasan | G01R 31/3624 320/132 |
| 2006/0229517 | A1* | 10/2006 | Lin | A61B 5/02007 600/490 |
| 2008/0238361 | A1* | 10/2008 | Pinnell | H02J 7/045 320/107 |
| 2009/0070052 | A1* | 3/2009 | Taniguchi | G01R 31/3651 702/63 |
| 2013/0138373 | A1 | 5/2013 | Lee et al. | |
| 2014/0111164 | A1* | 4/2014 | Ohkawa | H01M 10/441 320/134 |
| 2015/0072198 | A1* | 3/2015 | Fink | G01R 31/3624 429/90 |
| 2016/0028095 | A1* | 1/2016 | Sakai | G01R 31/3662 429/430 |

FOREIGN PATENT DOCUMENTS

| | | |
|---|---|---|
| CN | 101158709 | 4/2008 |
| CN | 102768304 | 11/2012 |
| CN | 103176134 | 6/2013 |
| CN | 103645382 | 3/2014 |

* cited by examiner

APPARATUS FOR MEASURING CELL INTERNAL RESISTANCE ONLINE AND MEASUREMENT METHOD THEREFOR

BACKGROUND OF THE INVENTION

Field of the Invention

The present invention relates to a battery measuring instrument and a measurement method, and more particular, to an apparatus for online measurement of a battery internal resistance and a measurement method of the apparatus for online measurement of the battery internal resistance.

Description of Related Art

Cell batteries with inherent characteristics of a low manufacturing cost, large capacity and low price have been widely applied in all science and technology areas in relation to the national economic development, including defense force, agriculture, and industrial areas and so on. Along with the continuous development and progress of science and technology, battery manufacturing companies continue to place higher requirements on the battery measuring instrument, which include the requirements for a higher precision of the testing parameters and reduced time in detecting all the parameters in addition to the comprehensive testing functions. An internal resistance of a battery is one of the significant parameters and technique index for judging the battery performance, and since the larger the capacity of the battery is, the smaller the internal resistance will be, the measurement of the internal resistance can be used to evaluate the size of the capacity, and moreover, a variation trend of the full life internal resistance value of the battery can be used to predict the lifespan of the battery. Therefore, the performance index i.e. the internal resistance of a battery attracts more and more attention, and the measurement of this index has important practical meaning.

The method of measuring the internal resistance of the battery currently adopted in this industry has two major types, including:

1. DC (direct current) discharge internal resistance measurement method: the DC discharge internal resistance measurement method is based on the physical formula R=U/I, a testing instrument forces a large constant DC current (at present, normally 40 A~80 A large current) into the battery within a short duration (normally 2~3 seconds), measures the voltage on two ends of the battery at the same time, and calculates the current internal resistance of the battery based on the formula. However, this measurement method has the following drawbacks: (1) this method is only applicable to measuring the large capacity battery or cell battery, and the small capacity battery cannot tolerate the 40 A~80 A large current within 2~3 seconds; (2) when the battery is loaded with the large current, the internal electrodes of the battery are polarized to produce a polarized internal resistance. Therefore, the measurement duration must be really short, or otherwise, the measurement error of the internal resistance value is significant; (3) the large current passes through the battery, causing damages to the internal electrodes of the battery and influencing the capacity and lifespan of the cell battery; (4) the measurement of the DC method can only be implemented in the static state or offline state, so the online measurement of the cell battery cannot be realized, which inevitably cause safety hazards to the equipment in operation.

2. AC (alternative current) buck internal resistance measurement method:

this AC method charges a constant AC current signal Is to a cell battery, measures a voltage response signal Vo on two ends of the cell battery and a phase difference cos, and determines the internal resistance R of the cell battery based on the impedance formula, but in the method, the internal resistance of the cell battery is small, the response voltage signal on two ends of the cell battery caused by the AC charging is weak and is prone to be interfered by the environmental noises, which is difficult to obtain the accurate measurement, and the AC current signal Is, the voltage response signal Vo, and the phase difference between the voltage and the current need to be measured. Therefore, this method is influenced by plenty of interference factors, which negatively impacts the precision, adds the complexity of the system, as well as influences the measurement precision.

Therefore, the battery measuring instrument in the prior art has the technical issues, which include in the online situation, the parameters available for detection are limited, the detected parameters are less precise, and the total time that the battery measuring instrument spend on detecting one battery is too long, which may be 3 S-5 S or more. Additionally, the battery measuring instrument in the prior art has the following defects: only couples of buttons are provided, which causes difficulties in operation; the display interface is complicated and difficult to understand; the testing result can only be obtained through observing the display screen. In view of the current status of the battery measuring instrument in the prior art, the battery measuring instrument and testing method encounter the technical difficulties/bottlenecks.

SUMMARY OF THE INVENTION

Technical Problem

An objective of the present invention is to provide an apparatus for online measurement of a battery internal resistance, which achieves the precise, rapid and convenient measurement of the internal resistance of a monomer cell in the battery in the situation that the battery is in circuit and on load. In addition, the present invention further provides a measurement method of the apparatus for online measurement of the battery internal resistance, which eliminates the influence of the load interference during the online measurement.

Technical Solution

To achieve the above objectives, the present invention provides an apparatus for measuring an internal resistance of a battery, which is applicable to online measure the internal resistance of the monomer cell in the battery, the measuring apparatus includes:

an excitation source circuit, electrically connected between any two monomer cells to be detected and a battery end, and forming a loop respectively or simultaneously with the two monomer cells, for respectively or simultaneously applying an alternative current signal twice to the monomer cells in the loop through the excitation source circuit;

an analog-to-digital conversion unit, respectively electrically connected to two monomer cell ends to be detected, for detecting and converting a response voltage of the monomer cell ends, and simultaneously electrically connected to the loop formed with the two monomer cells, for detecting and converting a current in the loop as well as detecting and converting a phase value between the current and the response voltage;

a digital signal processing unit, electrically connected to the analog-to-digital conversion unit, for calculating an internal resistance value of the monomer cell to be detected after receiving a conversion signal from the analog-to-digital conversion unit; the digital signal processing unit also sending a signal for controlling the excitation source circuit to apply an alternative current signal twice.

Furthermore, the battery is a single monomer cell or two or more serially connected monomer cells, and in the case of a single monomer cell, a resistor and one monomer cell are connected in series to be equivalent to two monomer cells.

Furthermore, the apparatus further includes a display communication unit, and the digital signal processing unit and the display communication unit interactively pass information.

Furthermore, the display communication unit includes a display screen, a CPU processor and a RS232/RS485 communication module.

Furthermore, the analog-to-digital conversion unit includes a signal detecting unit, for detecting the response voltage and the current signal, and the signal detecting unit includes a high pass filter module.

The present invention further provides a measurement method of the apparatus for measuring the internal resistance of the battery, which includes the steps of:

performing an online measurement of the monomer cell internal resistance on one monomer cell or two or more serially connected monomer cells;

in the case of a single monomer cell, serially connecting a resistor to be equivalent to two serially connected monomer cells;

electrically connecting the excitation source circuit between any two monomer cells to be detected and a battery end by means of wiring connection, and forming a loop respectively or simultaneously with two monomer cells to be detected, and respectively or simultaneously applying an alternative current signal twice to the monomer cells;

electrically connecting the analog-to-digital conversion unit to the two monomer cell ends to be detected respectively, detecting and converting a response voltage between the two monomer cell ends, also simultaneously electrically connecting the two monomer cells and a battery end, and forming a loop respectively or simultaneously with two monomer cells to be detected, detecting and converting a current in the loop as well as detecting and converting a phase value between the current and the response voltage;

electrically connecting the digital signal processing unit to the analog-to-digital conversion unit, calculating an internal resistance value of the two monomer cells to be detected after receiving a conversion signal from the analog-to-digital conversion unit; also sending, by the digital signal processing unit, a signal for controlling the excitation source circuit to apply an alternative current signal to the loop.

Furthermore, a formula for calculating the internal resistance of the loop formed with the two monomer cells respectively is:

$$r1=[V22^2*V11*Iy1*\cos(a)-V22*V11*V11*V21*Iy1*\cos(a+d-b)-V21*V12*V22*Iy1*\cos(b+c-d)+V12*V21^2*Iy2*\cos(c)]/(V22*Iy1)^2+(V21*Iy2)^2-2*V22*Iy1*V21*Iy2*\cos(b-d)$$

where the internal resistances of the two serially connected monomer cells are set to be r1 and r2 respectively; apply an alternative current signal twice to the monomer cells respectively, after applying an alternative current signal for the first time, the response voltages of the monomer cells are V11 and V21, the current is Iy1, a phase between V11 and Iy1 is a, and a phase between V21 and Iy1 is b; after applying the alternative current signal for the second time, the response voltages of the monomer cells are V22 and V12, the current is Iy2, a phase between V12 and Iy2 is c, and a phase between V22 and Iy2 is d.

Furthermore, a formula for calculating the internal resistance of the loop formed with the two monomer cells simultaneously is:

$$r1=[Vn2^2*V11*Iy1*\cos(a)-Vn2*V11*V11*Vn1*Iy1*\cos(a+d-b)-Vn1*V12*Vn2*Iy1*\cos(b+c-d)+V12*Vn1^2*Iy2*\cos(c)]/(Vn2*Iy1)^2+(Vn1*Iy2)^2-2*Vn2*Iy1*Vn1*Iy2*\cos(b-d)$$

where the internal resistances of any two serially connected monomer cells from among two or more monomer cells to be detected are r1 and rn respectively; apply the alternative current signal twice to the monomer cells simultaneously, after applying the alternative current signal for the first time, the response voltages of the monomer cell are V11 and Vn1, the current is Iy1, the phase between V11 and Iy1 is a, and the phase between Vn1 and Iy1 is b; after applying the alternative current signal for the second time, the response voltages of the monomer cells are Vn2 and V12, the current is Iy2, the phase between V12 and Iy2 is c, and the phase between Vn2 and Iy2 is d.

Furthermore, after applying the alternative current signal twice to the loop formed with the two monomer cells to be detected simultaneously, the current signal measured at the battery end is required to satisfy: Ix1/Iz1≠Ix2/Iz2 where after applying the alternative current signal for the first time, the battery end currents are Ix1 and Iz1, and after applying the alternative current signal for the second time, the battery end currents are Ix2 and Iz2.

The present invention applies the alternative current signal source twice on the monomer cells of one or two batteries, and simultaneously measures the corresponding current, voltage, and phase value between the current and the voltage and establishes an equation to obtain the internal resistance value of the monomer cell to be detected, and due to the presence of the interference of the parallel load and the power source equipment in the online measurement, the excitation of the alternative current signal needs to be applied twice in the calculation formula to obtain the equation, so as to compensate or eliminate the interference and influence, and based on the Kirchhoff's Current Law in combination with other principles and formula, each internal resistance value that needs to be measured can be deduced and obtained.

Advantageous Effect

The present invention has the beneficial efficacy of achieving the precise, efficient and convenient internal resistance measurement of the monomer cell without damaging the monomer cell and sacrificing the online load of the battery.

DETAILED DESCRIPTION OF THE INVENTION

Hereinafter, the embodiments of the present invention will be illustrated in details in combination with the drawings.

Figure 1:
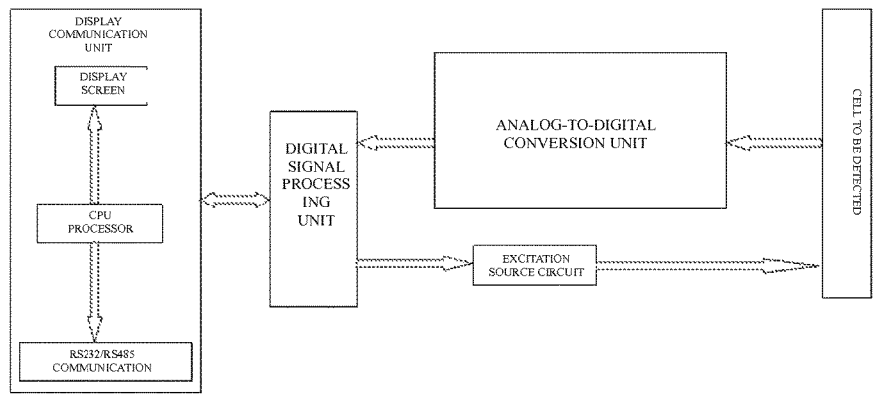
FIG. 1 is an architecture diagram illustrating a complete set of an apparatus for online measurement of a battery internal resistance according to the present invention.
Figure 2:
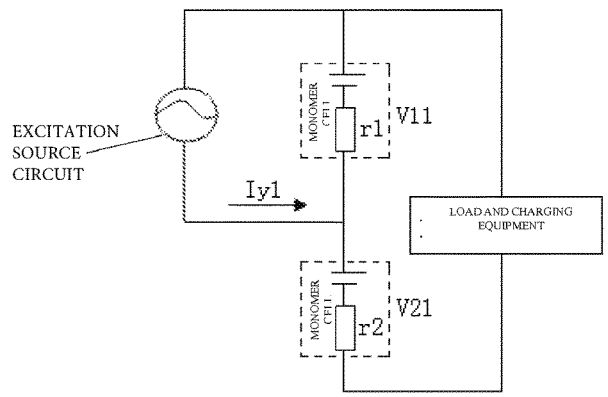
FIG. 2 is a schematic diagram illustrating an equivalent circuit for respectively applying an alternative current signal on the monomer cells for the first time according to the present invention.
Figure 3:
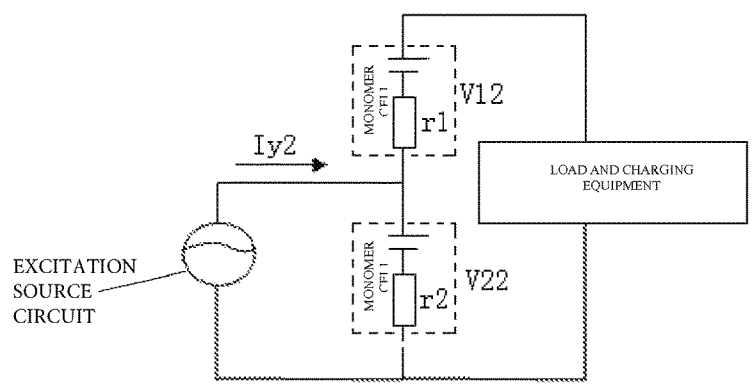
FIG. 3 is a schematic diagram illustrating an equivalent circuit for respectively applying the alternative current signal on the monomer cells for the second time according to the present invention.

In the first embodiment, referring to FIG. 1, FIG. 2 and FIG. 3, an apparatus for online measurement of a battery internal resistance and a measurement method thereof are provided and are applicable to measure an internal resistance of two serially connected monomer cells. The apparatus includes an excitation source circuit, an analog-to-digital conversion unit, a digital signal processing unit and a display communication unit, in which the analog-to-digital conversion unit further includes a signal detecting unit, the display communication unit includes a CPU processor, a display screen and a RS232/RS485 communication module, the excitation source circuit is electrically connected between the two monomer cells to be detected and a battery end, and a loop is formed with the two monomer cells respectively, and an alternative current signal is applied once before and once after the loop is formed with the monomer cells respectively.

The analog-to-digital conversion unit is respectively electrically connected to the two monomer cell ends to be detected by means of the signal detecting unit, for detecting and converting response voltages V11, V21, V12, V22 of two monomer cell ends, and meanwhile for detecting and converting the current Iy1 and Iy2 applied twice on the excitation source circuit between two monomer cells, as well as detecting and converting the phase a, b, c and d between the current and the response voltage, and the digital signal processing unit calculates the phase difference value.

The digital signal processing unit is electrically connected to the analog-to-digital conversion unit and respectively calculates the internal resistance values r1 and r2 of the two monomer cells to be detected after receiving the conversion signal from the analog-to-digital conversion unit; and the digital signal processing unit also sends a signal for controlling the excitation source circuit to apply the alternative current signal.

The display communication unit and the digital signal processing unit interactively pass information, in which the CPU processor and the digital signal processing unit transfer information, and the CPU processor controls the display screen and the RS232/RS485 communication module respectively.

This embodiment further provides a measurement method of the apparatus for online measurement of the battery internal resistance, as shown in FIG. 1, FIG. 2 and FIG. 3, and the internal resistance measurement method includes the following steps. The internal resistance measurement is carried out to measure the internal resistances r1 and r2 of the two serially connected monomer cell. The digital signal processing unit controls a Y end of the excitation source circuit to output an alternative current signal respectively to the two monomer cells. After the loop is formed by the X end and the Z end respectively with one monomer cell, the alternative current signal is applied once before and once after each loop is formed, the analog-to-digital conversion unit detects the response voltages V11 and V21, the current Iy1, the phase a between V11 and Iy1, and the phase b between V21 and Iy1 of the monomer cells by means of the signal detecting unit after the alternative current signal is applied for the first time; the analog-to-digital conversion unit detects the response voltages V22 and V12, the current Iy2, the phase c between V12 and Iy2, the phase d between V22 and Iy2 of the monomer cells after the alternative current signal is applied for the second time. The above-mentioned values are sent to the digital signal processing unit for calculating the internal resistance r1, based on the following formula:

$$r1=[V22^2*V11*Iy1*\cos(a)-V22*V11*V11*V21*Iy1*\cos(a+d-b)-V21*V12*V22*Iy1*\cos(b+c-d)+V12*V21^2*Iy2*\cos(c)]/(V22*Iy1)^2+(V21*Iy2)^2-2*V22*Iy1*V21*Iy2*\cos(b-d)$$

Likewise, the internal resistance r2 can be calculated.

This embodiment is also applicable to measure one monomer cell, and in the case of a single monomer cell, a resistor is connected in series to the monomer cell, so the serially connected resistor is equivalent to one monomer cell, thus realizing the internal resistance measurement in the circumstance of two serially connected monomer cells.

This embodiment has the beneficial efficacy of achieving the rapid and precise measurement of the healthy status and the state of charge of the cell battery and parameters of the connected resistor in the online and on load situation, and includes the following characteristics:

(1) Completely online measurement of the voltage and internal resistance of one or more batteries;

(2) Intelligent data processing, and providing convenience for maintenance personnel to analyze and process;

(3) Alarming when a cell battery fault occurs;

(4) Able to communicate with an upper computer, for uploading data;

(5) Providing operation options such as save, search and delete data; and (6) PC computer analyzing software may carry out operations on the uploaded data, including sorted storage, searching and deleting data, generating a file, free operations on the file, and backup database, and literally realize the storage of unlimited data.

By setting the communication parameters, the internal resistance scale and the voltage range after starting up, normally, the following functions can be realized: online measurement of the internal resistance of each one of the serially connected monomer cells (the testing can be carried out under the circumstance of the parallel power source and load); high luminance VFD screen display; measurement of the corresponding battery voltage; 1% measurement precision of the internal resistance of the battery; 0.02% measurement precision of the battery voltage; software monitoring with the computer; calibration with the software; expanding the paths through parallel connection; LCD color screen displaying (preserved expansion function, and preserved interface for circuits); adjustable AC excitation frequency; the setting of the measuring speed and so on; optimizing the cost control under the prerequisite of guaranteeing the quality; chic appearance, practicability, and easy and convenient operation.

Figure 4:
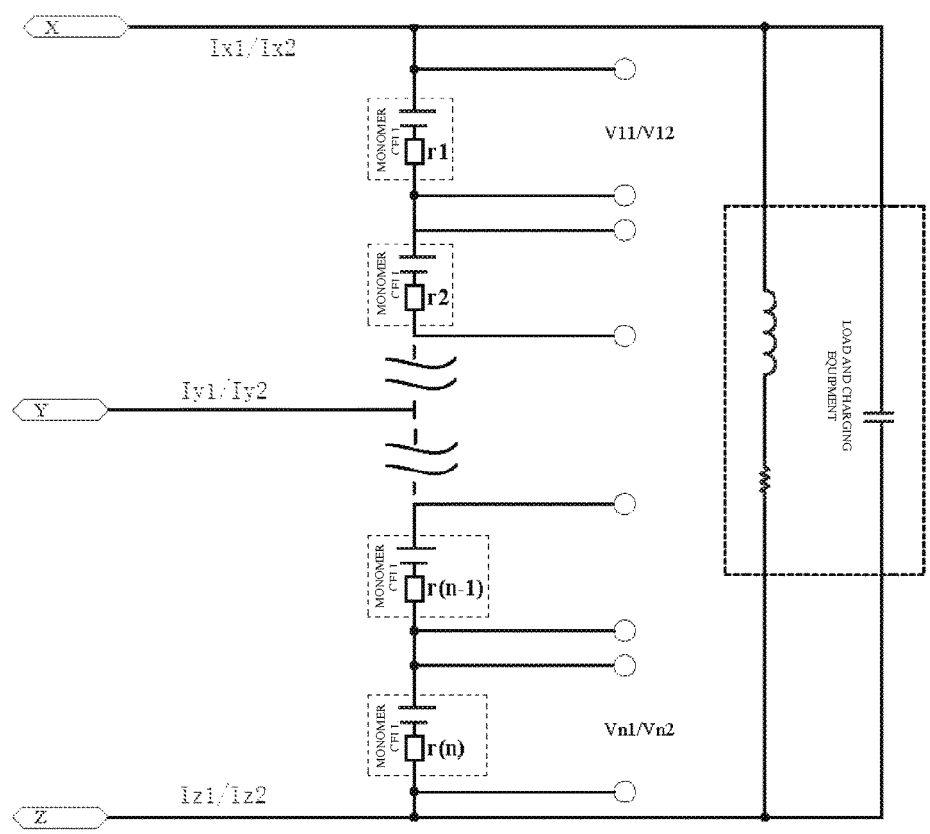
FIG. 4 is a schematic diagram illustrating an equivalent circuit for simultaneously applying the alternative current signal twice on the monomer cells according to the present invention.

In the second embodiment, referring to FIG. 1 and FIG. 4, the online and on load internal resistance measurement of more than two serially connected monomer cells is described, and in this embodiment, 1 to n monomer cells are set, the internal resistance r1 and rn of the monomer cells 1 and n are measured, and the internal resistances of the rest monomer cells are further obtained in the same way.

The excitation source circuit is electrically connected between the two monomer cells 1 and n to be detected and a battery end, a loop is formed with two monomer cells 1 and n simultaneously, and the alternative current signal is simultaneously applied twice on the monomer cells 1 and n.

The analog-to-digital conversion unit in this embodiment is respectively electrically connected to the monomer cells 1 and n to be detected by means of the signal detecting unit, for detecting and converting the response voltages V11, Vn1, V12, Vn2 of the two monomer cell ends, and simultaneously electrically connected, for detecting and converting the current Iy1 and Iy2 applied twice on the excitation source circuit between the two monomer cells and the current Ix1, Iz1, Ix2 and Iz2 at the battery end, as well as detecting and converting the phase a, b, c and d between the current and the response voltage, and the digital signal processing unit calculates the phase difference value.

The internal resistance measurement method includes the steps of: performing the internal resistance measurement on the internal resistances r1 and rn of the two serially connected monomer cells, controlling the Y end of the excitation source circuit by the digital signal processing unit to respectively output the alternative current signal to the two monomer cells 1 and n, and after the loop is formed by the X end and the Z end respectively with one monomer cell, applying the alternative current signal twice on the loop. The analog-to-digital conversion unit detects the response voltage V11 and Vn1, the current Iy1, Ix1, Iz1, the phase a between V11 and Iy1, and the phase b between Vn1 and Iy1 of the monomer cells 1 and n by means of signal detecting unit after the alternative current signal is applied for the first time; detects the response voltages V12 and Vn2, the current Iy2, Ix2, Iz2, the phase c between V12 and Iy2, the phase d between Vn2 and Iy2 of the monomer cells after the alternative current signal is applied for the second time. The measured current signal at the battery end after the alternative current signal is simultaneously applied twice on the two monomer cells 1 and n to be detected is required to satisfy: Ix1/Iz1≠Ix2/Iz2. The abovementioned values are sent to the digital signal processing unit for calculating the internal resistance r1, and the specific formula is:

$$r1=[Vn2^2*V11*Iy1*\cos(a)-Vn2*V11*V11*Iy1*\cos(a+d-b)-Vn1*V12*Vn2*Iy1*\cos(b+c-d)+V12*Vn1^2*Iy2*\cos(c)]/(Vn2*Iy1)^2+(Vn1*Iy2)^2-2*Vn2*Iy1*Vn1*Iy2*\cos(b-d)$$

Likewise, the internal resistance rn and the internal resistances of the rest monomer cells can be calculated.

What is claimed is:

1. An apparatus for online measurement of a battery internal resistance while the battery is on load, applicable to online measure the internal resistance of a each of two monomer cells selected from two or more monomer cells connected by a serial connection in the battery, the measuring apparatus comprising:
    an excitation source, connected in parallel with a first monomer cell of the selected two monomer cells of the battery and at each end of the series of two or more monomer cells, thereby forming a first loop with the first monomer cell and a second loop with a second monomer cell of the selected two monomer cells and all unselected monomer cells at a first time, connected in parallel with the second monomer cell of the selected two monomer cells of the battery and at each end of the series of two or more monomer cells thereby forming a third loop with the second monomer cell of the selected two monomer cells and a fourth loop with the first monomer cell of the selected two monomer cells and all unselected monomer cells at a second time, wherein the excitation source applies a first alternative current signal at the first time via the first loop and the second loop and applies a second alternative signal at the second time via the third loop and the fourth loop;
    an analog-to-digital conversion unit, respectively electrically connected to each of the two selected monomer cells, for detecting and converting a response voltage of each selected monomer cell while the excitation source is connected, and simultaneously connected to the excitation source, for detecting and converting the alternative current, as well as detecting and converting a phase value between the alternative current and the response voltage for each of the selected monomer cells; and
    a digital signal processing unit, electrically connected to the analog-to-digital conversion unit, for calculating an internal resistance value of each of the two selected monomer cells after receiving a conversion signal from the analog-to-digital conversion unit, the digital signal processing unit also configured to send a signal to control the excitation source circuit to apply the alternative current signal to each of the two monomer cells twice.

2. The apparatus for online measurement of the battery internal resistance according to claim 1, wherein a first monomer cell of the two or more monomer cells is a resistor that functions as a monomer cell.

3. The apparatus for online measurement of the battery internal resistance according to claim 1, wherein the apparatus further comprises a display communication unit, and the digital signal processing unit and the display communication unit interactively pass information.

4. The apparatus for online measurement of the battery internal resistance according to claim 3, wherein the display communication unit comprises a display screen, a CPU processor and a RS232/RS485 communication module.

5. The apparatus for online measurement of the battery internal resistance according to claim 1, wherein the analog-to-digital conversion unit comprises a signal detecting unit, for detecting the response voltage and the current signal, and the signal detecting unit comprises a high pass filter module.

6. A method for measuring the internal resistance of a battery while the battery is on load having a series of at least two monomer cells connected by a serial connection in the battery, by implementing an apparatus for online measurement of a battery internal resistance, wherein the method for measuring the internal resistance comprises the steps of:
    performing an online measurement of monomer cell internal resistance on each of any two monomer cells selected of the at least two monomer cells;
    connecting an excitation source circuit in parallel with a first monomer cell of the selected two monomer cells of the battery and at each end of the serial connection, thereby forming a first loop with the first monomer cell and a second loop with a second monomer cell of the two selected monomer cells and all unselected monomer cells, and applying an alternative current signal to the first loop and the second loop at a first time;
    disconnecting the excitation source from the first and second loops;
    connecting the excitation source in parallel to the second monomer cell of the selected two monomer cells of the battery and at each end of the serial connection, thereby forming a third loop with the second monomer cell of the selected two monomer cells and a fourth loop with the first monomer cell of the selected two monomer cells and all unselected monomer cells, and applying an alternative current to the third and fourth loops at a second time;

electrically connecting, at the first time and the second time, an analog-to-digital conversion unit to each of the two selected monomer cells, detecting and converting a response voltage to each of the two selected monomer cells, and, detecting and converting the alternative current in each of the loops as well as detecting and converting a phase value between the applied alternative current and the response voltage for each of the selected monomer cells; and electrically connecting a digital signal processing unit to the analog-to-digital conversion unit, calculating an internal resistance value of each of the two selected monomer cells after receiving a conversion signal from the analog-to-digital conversion unit, and sending, by the digital signal processing unit, a signal to control the excitation source circuit to apply an alternative current signal to the loops.

7. The method of measuring battery internal resistance according to claim 6, wherein a formula for calculating the internal resistance of the first and second loops formed with the first and second monomer cells respectively is:

$$r1=[V22^2*V11*Iy1*\cos(a)-V22*V11*V11*V21*Iy1*\cos(a+d-b)-V21*V12*V22*Iy1*\cos(b+c-d)+V12*V21^2*Iy2*\cos(c)]/(V22*Iy1)^2+(V21*Iy2)^2-2*V22*Iy1*V21*Iy2*\cos(b-d)$$

calculating in the same manner to obtain r2 where the internal resistances of the two serially connected monomer cells are set to be r1 and r2 respectively; apply an alternative current signal twice to the first and second monomer cells respectively, after applying the alternative current signal for the first time, the response voltages of the first and second monomer cells are V11 and V21 respectively, the current is Iy1, a phase between V11 and Iy1 is a, and a phase between V21 and Iy1 is b; after applying the alternative current signal for the second time, the response voltages of the first and second monomer cells are V22 and V12 respectively, the current is Iy2, a phase between V12 and Iy2 is c, and a phase between V22 and Iy2 is d.

8. The method of measuring battery internal resistance according to claim 6, wherein a formula for calculating the internal resistance of the first and a nth loop formed with the first and a nth monomer cells of the at least two monomer cells simultaneously is:

$$r1=[Vn2^2*V11*Iy1*\cos(a)-Vn2*V11*V11*Vn1*Iy1*\cos(a+d-b)-Vn1*V12*Vn2*Iy1*\cos(b+c-d)+V12*Vn1^2*Iy2*\cos(c)]/(Vn2*Iy1)^2+(Vn1*Iy2)^2-2*Vn2*Iy1*Vn1*Iy2*\cos(b-d)$$

calculating in the same manner to obtain $r_n$, wherein n is an integer and wherein $r_n$ is a nth monomer cell in series, wherein the internal resistances of any two serially connected monomer cells from among two or more monomer cells are r1 and $r_n$ respectively; apply the alternative current signal twice to the monomer cells simultaneously, after applying the alternative current signal for the first time, the response voltages of the monomer cells are V11 and Vn1 respectively, the current is Iy1, the phase between V11 and Iy1 is a, and the phase between Vn1 and Iy1 is b; after applying the alternative current signal for the second time, the response voltages of the monomer cells are Vn2 and V12 respectively, the current is Iy2, the phase between VI2 and Iy2 is c, and the phase between Vn2 and Iy2 is d.

9. The method of measuring battery internal resistance according to claim 8, wherein after applying the alternative current signal twice to the first and nth loops formed with each of the first and nth monomer cells simultaneously, the current signal measured at the battery end is required to satisfy: $Ix1/Iz1 \neq Ix2/Iz2$ wherein after applying the alternative current signal for the first time, the battery end currents are Ix1 and Iz1, and after applying the alternative current signal for the second time, the battery end currents are Ix2 and Iz2.

10. The method of measuring battery internal resistance according to claim 6, wherein a first monomer cell of the two or more monomer cells is a resistor that functions as a monomer cell.

11. The method of measuring battery internal resistance according to claim 6, wherein the first and second loops are formed respectively with each of the first and second monomer cells for respectively applying an alternative current signal twice to each of the first and second monomer cells in the first and second loops through the excitation source circuit.

12. The method of measuring battery internal resistance according to claim 6, wherein the first and second loops are formed simultaneously with each of the first and second monomer cells for simultaneously applying an alternative current signal twice to each of the first and second monomer cells in the first and second loops through the excitation source circuit.

13. The apparatus for online measurement of the battery internal resistance according to claim 1, wherein the alternative current applied by the excitation source at the first time and the second time is the same.

14. The apparatus for online measurement of the battery internal resistance according to claim 1, wherein the alternative current applied by the excitation source at the first time and the second time is different.

15. The method of measuring the internal resistance of a battery while the battery is on load according to claim 6, wherein the alternative current applied by the excitation source at the first time and the second time is the same.

16. The method of measuring the internal resistance of a battery while the battery is on load according to claim 6, wherein the alternative current applied by the excitation source at the first time and the second time is different.

* * * * *